(12) United States Patent
Schmidt (10) Patent No.: US 12,413,224 B2
(45) Date of Patent: Sep. 9, 2025

(54) AVALANCHE PROTECTION CIRCUIT (71) Applicant: Infineon Technologies AG, Neubiberg (DE)

(72) Inventor: Benjamin Schmidt, Munich (DE)

(73) Assignee: Infineon Technologies AG, Neubiberg (DE)

( * ) Notice: Subject to any disclaimer, the term of this patent is extended or adjusted under 35 U.S.C. 154(b) by 222 days.

(21) Appl. No.: 18/186,515

(22) Filed: Mar. 20, 2023

(65) Prior Publication Data

US 2024/0322812 A1 Sep. 26, 2024

(51) Int. Cl.
*H03K 17/082* (2006.01)
*H03K 17/06* (2006.01)

(52) U.S. Cl.
CPC ....... *H03K 17/0822* (2013.01); *H03K 17/063* (2013.01); *H03K 17/082* (2013.01); *H03K 2217/0027* (2013.01)

(58) Field of Classification Search
CPC .. H03K 17/082; H03K 17/06; H03K 17/0822; H03K 1/063; H03K 2217/0027; H02H 3/06; H02H 3/08; H02H 3/087
USPC ..................... 361/86–87, 91.1, 111
See application file for complete search history.

(56) References Cited

U.S. PATENT DOCUMENTS

| 11,171,481 | B1* | 11/2021 | Hudson | B60R 16/033 |
| 12,179,679 | B2* | 12/2024 | Draese | B60R 16/0238 |
| 2009/0289691 | A1* | 11/2009 | Fuller | H03K 17/284 |
| | | | | 327/432 |
| 2012/0236456 | A1* | 9/2012 | Yu | H05B 47/25 |
| | | | | 361/91.1 |
| 2018/0366936 | A1* | 12/2018 | Kennedy | H02H 3/05 |
| 2022/0038089 | A1* | 2/2022 | Heinrich | H03K 17/122 |
| 2022/0115863 | A1* | 4/2022 | Lapassat | H01H 33/596 |
| 2023/0187923 | A1* | 6/2023 | Lu | H01H 9/54 |
| | | | | 361/93.1 |

OTHER PUBLICATIONS

"Some Key Facts About Avalanche", Infineon, Application Note V1.0, Accessed on: Mar. 17, 2023 , 37 pp.
Schoiswohl, "Linear Mode Operation and Safe Operating Diagram of Power-MOSFETs", Infineon, Application Note V1.1, May 2017, 13 pp.

* cited by examiner

*Primary Examiner* — Danny Nguyen
(74) *Attorney, Agent, or Firm* — Shumaker & Sieffert, P.A.

(57) ABSTRACT

Circuitry and techniques for detecting a circuit malfunction and disconnecting a main switch when the main switch comprises two or more smaller MOSFET switches connected in parallel. The circuitry of this disclosure includes a protection circuit switch using a protection switch arranged in parallel to the main switch. The protection switch circuit is configured to relieve the main switch MOSFETs as energy dissipates after the main switch circuit detects a fault and shuts off power to a load, but energy stored in the cable harness as inductance may cause current to continue to flow through the main switch MOSFETS. Dissipating this stored energy may result in an avalanche event in MOSFETs of the main switch. The protection circuit of this disclosure take more current shortly after the main switch turns OFF when the break-down voltages of the main switch MOSFETs may not be aligned.

17 Claims, 7 Drawing Sheets

AVALANCHE PROTECTION CIRCUIT

TECHNICAL FIELD

The disclosure relates to power switch circuits and more specifically, to protection circuitry for power switch circuits.

BACKGROUND

In some applications, a power supply may connect to a load through a switch arrangement. For loads with a relatively high power demand, such as motors for vehicles, the switch arrangement may include multiple smaller switches in parallel so that a single switch does not carry all the current to the load and for the switch arrangement to achieve the desired on-resistance of the main switch for steady state operation. In the example of vehicles that carry passengers, such as hybrid or electric automobiles, electric vertical take-off and landing (eVTOL) and similar urban air mobility (UAM) vehicles, such vehicles may have functional safety features to protect passengers and the vehicle.

SUMMARY

In general, the disclosure describes circuitry and techniques for detecting a circuit malfunction and disconnecting a main switch when the main switch comprises two or more smaller switches connected in parallel. In some examples the switches connected in parallel may be implemented using metal oxide semiconductor field effect transistors (MOSFET). The circuitry of this disclosure includes a protection circuit switch design using one or more protection MOSFETs arranged in parallel to the main switch. The protection switch circuit is configured to relieve the main switch MOSFETs while current and energy dissipates after the main switch circuit detects a fault and shuts off power to a load. In some examples, energy stored in the cable harness as inductance may cause current to continue to flow through the main switch MOSFETS after the main switch shuts off. Without additional countermeasures, dissipating this stored energy may happen with an avalanche event of the MOSFETs that make up the main switch. The protection circuit of this disclosure may react dynamically so that the protection MOSFET takes more current shortly after the main switch turns OFF, e.g., when the break-down voltages of the main switch MOSFETs may not be aligned.

In one example, this disclosure describes a circuit comprising a main switch circuit, configured to connect a power source to a load, the main switch circuit comprising a plurality of metal oxide semiconductor field effect transistors (MOSFET), wherein the plurality of MOSFETs are arranged in parallel; a protection switch circuit connected in parallel to the main switch circuit and, wherein the protection switch circuit, when conducting, is configured to carry at least some electrical current to the load; and control circuitry connected to a control terminal of the protection switch, wherein the control circuitry is configured to: detect a fault on load side of the main switch; and in response to detecting the fault, cause the protection switch circuit to carry a first magnitude of electrical current for a first duration and carry a second magnitude of electrical current for a second duration subsequent to the first duration.

In another example, this disclosure describes a device comprising a protection switch circuit arranged in parallel with the main switch circuit, wherein the main switch circuit comprises a plurality of metal oxide semiconductor field effect transistors (MOSFETs) arranged in parallel with each other, wherein the main switch circuit is configured to connect a power source to a load, and wherein the protection switch comprises a control terminal and a drain-source channel, wherein the protection circuit is configured to: receive a control signal at the control terminal; and in response to the control signal causing the protection switch to operate in a linear region, carry at least some electrical current to the load.

In another example, this disclosure describes a method comprising conducting, by a main switch of disconnect switch circuitry, electrical power to a load, wherein the main switch comprises a plurality of metal oxide semiconductor field effect transistors (MOSFET), wherein the plurality of MOSFETs are arranged in parallel; determining by control circuitry of the disconnect switch circuitry, whether there is a fault on a load side of the main switch; in response to detecting the fault, causing a protection switch of the disconnect switch circuitry to carry a first magnitude of electrical current for a first duration and carry a second magnitude of electrical current for a second duration subsequent to the first duration, wherein the protection switch is connected in parallel to the main switch and, when conducting, is configured to carry at least some electrical current to the load.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure describes circuitry and techniques for detecting a circuit malfunction and disconnecting a main switch when the main switch comprises two or more smaller switches connected in parallel. In some examples the switches connected in parallel may be implemented using metal oxide semiconductor field effect transistors (MOSFET). The circuitry of this disclosure includes a protection circuit switch design using one or more protection MOSFETs arranged in parallel to the main switch. The protection switch circuit is configured to relieve the main switch MOSFETs as current and energy dissipates after the main switch circuit detects a fault and shuts off power to a load. The protection circuit of this disclosure may react dynamically so that the protection MOSFET takes more current shortly after the main switch turns OFF, e.g., when the break-down voltages of the main switch MOSFETs may not be aligned.

One challenge selecting a MOSFET for use in a relatively high power demand configuration is the short circuit robustness of the switches during disconnect. For example, after detection of an overcurrent event, e.g., caused by a full or partial short circuit, the MOSFETs of the main switch may be turned off to protect the power source, e.g., a battery, the load and other circuitry in the power distribution system. In some examples, energy may be stored in the cable harness since inductance can cause current to continue to flow after disconnecting, and such energy should be dissipated in some way. Without additional countermeasures, dissipating this stored energy may happen with an avalanche event of the MOSFETs that make up the main switch. Therefore, selecting MOSFETs with a high avalanche current rating may avoid destruction and with a high energy rating may avoid MOSFET over-heating. However, such MOSFETs may be relatively expensive, and may have other less desirable steady state performance characteristics. The parallel structure of the main switch may also bring additional challenges as the energy and the current may not equally distribute across parallel MOSFETs. Also the MOSFETs may not all shut off at the same time, leaving one or more slower acting MOSFETs to carry the entire current load. With the added protection switch circuit, costly TVS diodes, snubber circuits, freewheeling circuits and other similar countermeasures might not be required to protect the main switch, or at least may be significantly reduced in size.

Figure 1:
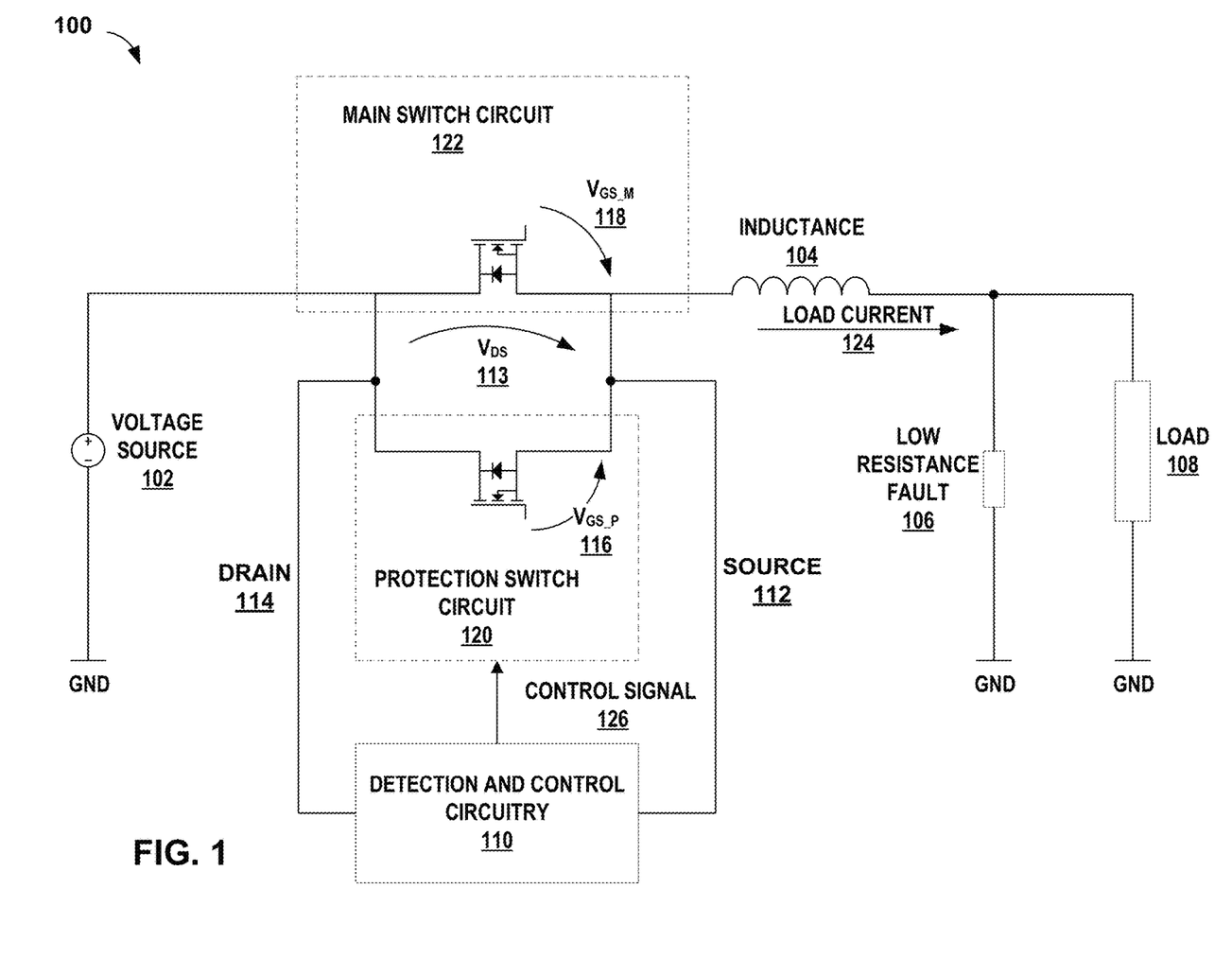
FIG. 1 is a schematic diagram illustrating example disconnect switch circuitry of this disclosure.

FIG. 1 is a schematic diagram illustrating example disconnect switch circuitry of this disclosure. The example of system 100 in FIG. 1 is a simplified schematic diagram of a system configured to connect a power source, e.g., voltage source 102 to load 108 through main switch circuit 122. Voltage source 102 connects between ground and main switch circuit 122, through inductance 104 and to load 108, which also connects to ground. In some examples, voltage source 102 may be implemented as a battery, or some other power source. In some examples, ground may be a system ground, circuit ground or some reference voltage.

In some examples, main switch circuit 122 may be configured to disconnect voltage source 102 from load 108 in the event of a fault, such as low resistance fault 106. In system 100 low resistance fault 106 connects in parallel with load 108 to ground. In some examples, low resistance fault 106 may cause an overcurrent condition in system 100, and disconnecting main switch circuit 122 may protect voltage source 102 and/or load 108 from damage, as well as ensure safe operation.

In the example of system 100, main switch circuit 122 is shown as a metal oxide semiconductor field effect transistors (MOSFET) in which load current 124 travels through the drain-source channel of main switch circuit 122. In some examples, main switch circuit 122 may be implemented as a plurality of MOSFETs, where the plurality of MOSFETs are arranged in parallel to share load current 124 and to achieve the desired on-resistance ($R_{DS-ON}$) of the main switch for steady state operation. The gate-source voltage, Vgs-m 118, connects between the control terminal, e.g., the gate, of main switch circuit 122 and source 112.

The wiring harness, e.g., printed circuit board paths, lead frames, wires, connections, and other wiring harness components, may include an inductance, which is modeled as inductance 104. In the event that main switches 122 disconnect power from load 108, inductance 104 may store energy and cause load current 124 to continue for a period of time, e.g., for a few milliseconds or less. In other words, after detection of a short circuit or other fault by a control circuit for the main switch (not shown in FIG. 1), the MOSFETs of main switch circuit 122 may be turned off and energy stored in the cable harness inductance 104 should be dissipated in some way. Without additional countermeasures, system 100 may dissipate the energy stored by inductance 104 as an avalanche event of the MOSFETs of main switch 122.

An avalanche breakdown may occur when a high reverse voltage is applied across a P-N junction, such as the body diode of the MOSFETs of main switch 122. As the applied reverse voltage increases, the electric field across the junction increases. This electric field exerts a force on the electrons at the junction and frees them from covalent bonds. The free electrons may collide with other atoms, knock other bound electrons out of atoms and create electron-hole pairs. This knocking-out process continues, increasing the number of free electrons and leading to avalanche breakdown. In a MOSFET, breakdown voltage is the voltage at which the reverse-biased body-drift diode breaks down and significant current starts to flow between the source and drain by the avalanche multiplication process, while the gate and source are shorted together, e.g., Vgs-m 118 is zero or approximately zero. Breakdown voltage for a MOSFET is sometimes abbreviated as BVDSS.

In the event that the current through the power MOSFET exceed a maximum current value for that MOSFET, the MOSFET may be subject to destruction from one or more different processes, such as from the electrical current during partial avalanche in linear mode, latch-up destruction, or other processes. Damage to main switch circuit 122 may mean that main switch circuit 122 may need to be replaced for system 100 to function again. In some examples, the damage, such as from the latch-up mechanism for the power MOSFETs of main switch circuit 122 may be caused by triggering an inherent bipolar junction transistor of the MOSFET, based on the structure of a power MOSFET. Triggering this internal BJT may cause the drain of the MOSFET to short to the source, causing permanent damage. Therefore, protection switch circuit 120 and detection and control circuitry 110 may be configured to reduce the current through main switch circuit 122 to prevent latch-up damage for the MOSFETs of main switch circuit 122. The maximum electrical current value that may cause damage may be different for different types and models of MOSFETs. The maximum current value, as well as the drain-source current (abbreviated $I_D$, or $I_{DS}$) while in breakdown may also be different for different MOSFETs of the same type and model because of manufacturing variation.

Protection switch circuit 120 may be implemented as one or more MOSFETS, and protection switch circuit 120 may connect in parallel to main switch circuit 122 as shown in FIG. 1, e.g., the drain of protection switch circuit 120 connects to the drain of main switch circuit 122 at drain 114. Similarly, the source of protection circuit 120 connects to the source of main switch circuit 122 at source 112. The drain-source voltage is $V_{DS}$ 113 in the example of FIG. 1. When turned ON and conducting, protection switch circuit 120 is configured to carry at least some electrical current to load 108. By sharing some of the electrical current, e.g., residual load current 124 caused by inductance 104, protection switch circuit 120 may reduce the current through the MOSFETs of main switch circuit 122 and prevent the $I_{DS}$ for any of the main switch MOSFETs from exceeding the maximum current threshold that may result in damage, including damage caused by latch-up. In some examples, the one or more MOSFETs used for protection switch circuit 120 may have a higher breakdown voltage than the MOSFETs used for main switch circuit 122. In this manner, system 100 may avoid protection switch circuit 120 from going into avalanche when main switch circuit 122 goes into avalanche.

Detection and control circuitry 110, (also called "control circuitry 110" for short) connects to the control terminal of the protection switch, e.g., the gate of the protection switch MOSFET as shown in FIG. 1, as well as to drain 114 and source 112. Control circuitry 110 may be implemented as digital circuitry, including processing and/or logic circuitry, as analog circuitry, or some combination of analog and digital circuitry. Control circuitry 110 may detect a fault on load side of the main switch. In response to detecting the fault, control circuitry 110 may cause protection switch circuit 120 to carry a first magnitude of electrical current for a first duration and carry a second magnitude of electrical current for a second duration subsequent to the first duration. In some examples, the first magnitude of electrical current, e.g., $I_{DS}$ for protection circuit 120, may be greater than the second magnitude of electrical current. In some examples, the first duration may be shorter in time and higher in current compared to the second duration.

In some examples, the fault detection of control circuitry 110 may be considered an indirect fault detection. That is, main switch circuit 122 may have its own control circuitry (not shown in FIG. 1) that is configured to detect a fault, e.g., a fault on the load side of the main switch such as low resistance fault 106. This main switch control circuitry may be configured to detect over current faults, over temperature faults, or other faults, and switch OFF main switch 122 to prevent damage to system 100, or to users of system 100.

In some examples, turning OFF main switch 122 may cause the drain-source voltage for both main switch circuit 122 and protection switch circuit 120, to increase in response to load current 124 caused by dissipating the energy in inductance 104. Therefore, in some examples, control circuitry 110, may detect the fault based on the drain-source voltage of the main switch circuit 122, and protection switch circuit 120, that satisfies an overvoltage threshold. Thus, in some examples detecting the overvoltage may be considered an indirect fault detection for some other fault on the load side of system 100, such as over temperature, over current, or some other fault.

In some examples, protection switch circuit 120 may relieve the main switch MOSFETs in a controlled and dynamic way from any current and energy remaining after a short circuit, or other fault, causes turn-off of main switch circuit 122, generated by inductance 104. Protection switch circuit 120 may react dynamically so that the protection MOSFET takes more current at the beginning e.g. for the first duration, when the break-down voltages of the parallel MOSFETS of main switch 122 may not be aligned. To control the drain-source current and timing for protection switch circuit 120, the one or more MOSFETs of protection switch circuit 120 may be configured for high current capability in linear mode and flat transfer characteristics. A "flat transfer characteristic" means a low transconductance, e.g., a small change of drain current dependent on the gate voltage when operating in linear mode.

In this disclosure the three modes of operation for a MOSFET are described as (a) cutoff, (b) triode or linear mode, and (c) saturation or constant-current. During linear mode a MOSFET behaves as a gate voltage controlled current source. Contrary to what happens when fully ON, e.g., in saturation mode, the drain-source impedance in linear mode may be relatively high when compared with fully ON resulting in higher power dissipation in linear mode. In contrast, for the saturation region, the $I_D$ for a MOSFET appear nearly "flat," e.g., the drain current does not increase any more as $V_{DS}$ increases.

For operation in the linear region, the $R_{DS\text{-}ON}$ properties of the MOSFET may be less of a factor than for the saturation region. Control signal 126 from control circuitry 110 to the control terminal, e.g., to the gate, of protection switch circuit 120 may set the operating point for protection switch circuit 120 in the linear region. In this manner, control circuitry 110 may output control signal 126 to control protection switch circuit to carry a first magnitude of electrical current for a first duration and carry a second magnitude of electrical current for a second duration, as described above. Control circuitry 110 may also control the timing using control signal 126, e.g., that in some examples, the second duration may be longer than the first duration.

Protection switch circuit 120, along with the control process may have advantages over other types of protection countermeasures for a disconnect switch circuit such as main switch circuit 122. The control process of this disclosure may include to detect an overvoltage then control protection switch circuit 120 to carry a first magnitude of electrical current for a first duration and a reduced magnitude of current for a second duration to dissipate energy from inductance 104. For example, such countermeasures as freewheeling circuits, e.g., using MOSFETs or diodes may provide protection in some circumstances. However, freewheeling circuits may not always be provide protection depending on current direction, which can change, e.g., between battery charging and discharging or where inductance 104 is located relative to main switch circuit 122. Also use of freewheeling devices as a protection countermeasure can be quite costly, such as when the freewheeling circuit must be protected against reverse polarity conditions.

Another possible countermeasure may include the use of transient voltage suppression (TVS) diodes. Besides high costs, TVS diodes may be challenging to use because the electrical current during clamping might be dynamic and not predictable. In many examples, TVS diodes have large parasitic series inductance, which leads to a slow reaction and may not be fast enough to protect the MOSFETs of main switch circuit 122 from the initial current spike. Therefore snubber circuits might also be added to absorb the energy until the TVS diode takes a share of the current, increasing cost, complexity, and circuit package size.

In some examples, protection switch circuit 120 may be used in combination with any other countermeasure circuitry. In some examples, the protection circuitry of this disclosure may allow a less robust MOSFET, e.g., less current carrying capacity, to be used to implement main switch 122, thereby reducing the cost, and size, when compared to a main switch circuit that does not use the protection circuitry and operating techniques of this disclosure.

In some examples, system 100 may be implemented as a circuit package including protection switch circuit 120 that is configured to be connected in parallel to a separate main switch circuit. A separate detection and control circuitry package may be configured to connect to source 112, drain 114 and to the control terminal of protection switch circuit 120. In other examples, the protection circuitry may be implemented as a circuit package that includes protection switch circuit 120, e.g., with one or more protection switches, along with detection and control circuitry 110. The combined package may be configured to operate based on the characteristics of main switch circuit 122 and connect to source 112 and drain 114 of main switch 122. In other examples, main switch circuit 122, protection switch circuit 120 and detection and control circuitry 110 may be implemented as a single circuit package, e.g., one or more integrated circuit die connected to a lead frame.

Figure 2:
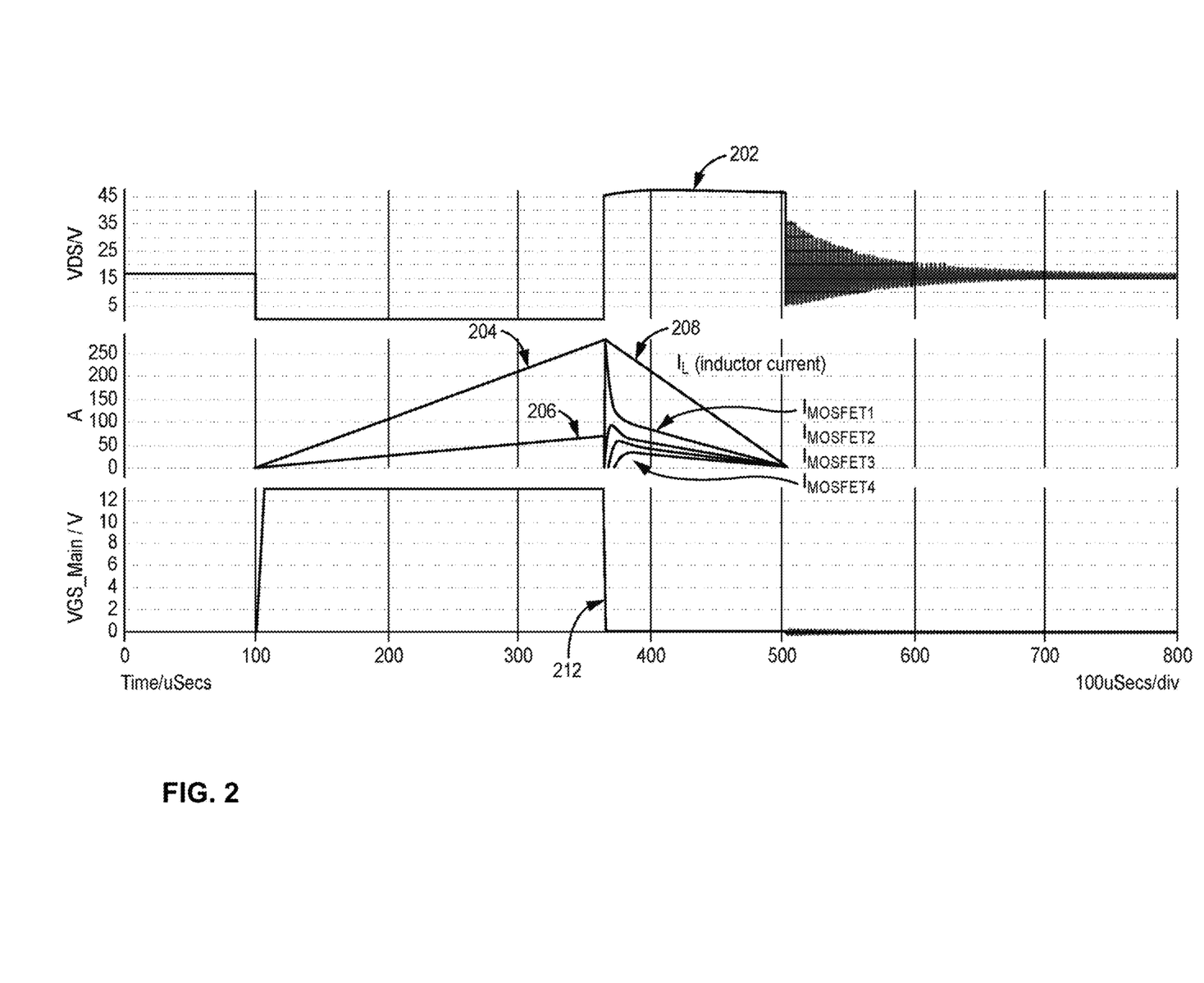
FIG. 2 is a time graph diagram illustrating example circuit behavior for a main switch comprising a plurality of parallel MOSFETs.

FIG. 2 is a time graph diagram illustrating example circuit behavior for a main switch comprising a plurality of parallel MOSFETs. The example of FIG. 2 illustrates the switching behavior of a disconnect switch circuit, such as system 100, without protection circuit 120 and control circuitry 110 described above in relation to FIG. 1. In the example of FIG. 1, the main switch includes four MOSFETs in parallel. In other examples, any number of MOSFETs may be arranged in parallel for the disconnect switch circuitry of this disclosure.

At approximately time 100 microseconds (µs), $V_{GS\_main}$ 212 goes high, turning ON MOSFETS 1, 2, 3 and 4, which operate in saturation mode. The current for each of the MOSFETS increase approximately together, as shown by 206, as the inductor current, $I_L$ increases, as indicated by 204.

When the main switch is turned OFF, at approximately time 360 µs, the inductor current begins to decrease (208), and the each of the four MOSFETs of the main switch continue to carry the residual inductor current. The voltage across the main switch, $V_{DS}$ 202, steps up to over 45 V, in the example of FIG. 2, which is the breakdown voltage for MOSFETs, as the energy in the inductance dissipates.

As shown in FIG. 2, arranging multiple switches in parallel may bring additional challenges as the energy and the current may not equally distribute across parallel MOSFETs. The example of FIG. 2 shows an avalanche example with MOSFETS 1, 2, 3 and 4. Each MOSFET may have a different configured break-down voltage. The avalanche event starts around time 360 µs, when MOSFET 1 with the lowest break-down voltage takes all the current for a short time, $I_{MOSFET1}$. The break-down voltage of a MOSFET may increase with temperature. Therefore one by one the MOSFETs go into avalanche as the break-down voltage level increases due to self-heating and current, shown by $I_{MOSFET1}$, $I_{MOSFET2}$, $I_{MOSFET3}$, and $I_{MOSFET4}$. This behavior variation may be caused by process variation of the MOSFET break-down voltage, but can also be influenced by a different initial temperature of each MOSFET, different gate threshold, capacitances, or PCB layout, which may make the worst case current assessment difficult.

As described above in relation to FIG. 1, the first current peak seen by MOSFET 1, if greater than a maximum current for that type of MOSFET, may cause latch-up destruction. More paralleling does not help, e.g., by adding additional MOSFETs, because of the variation described above.

Figure 3:
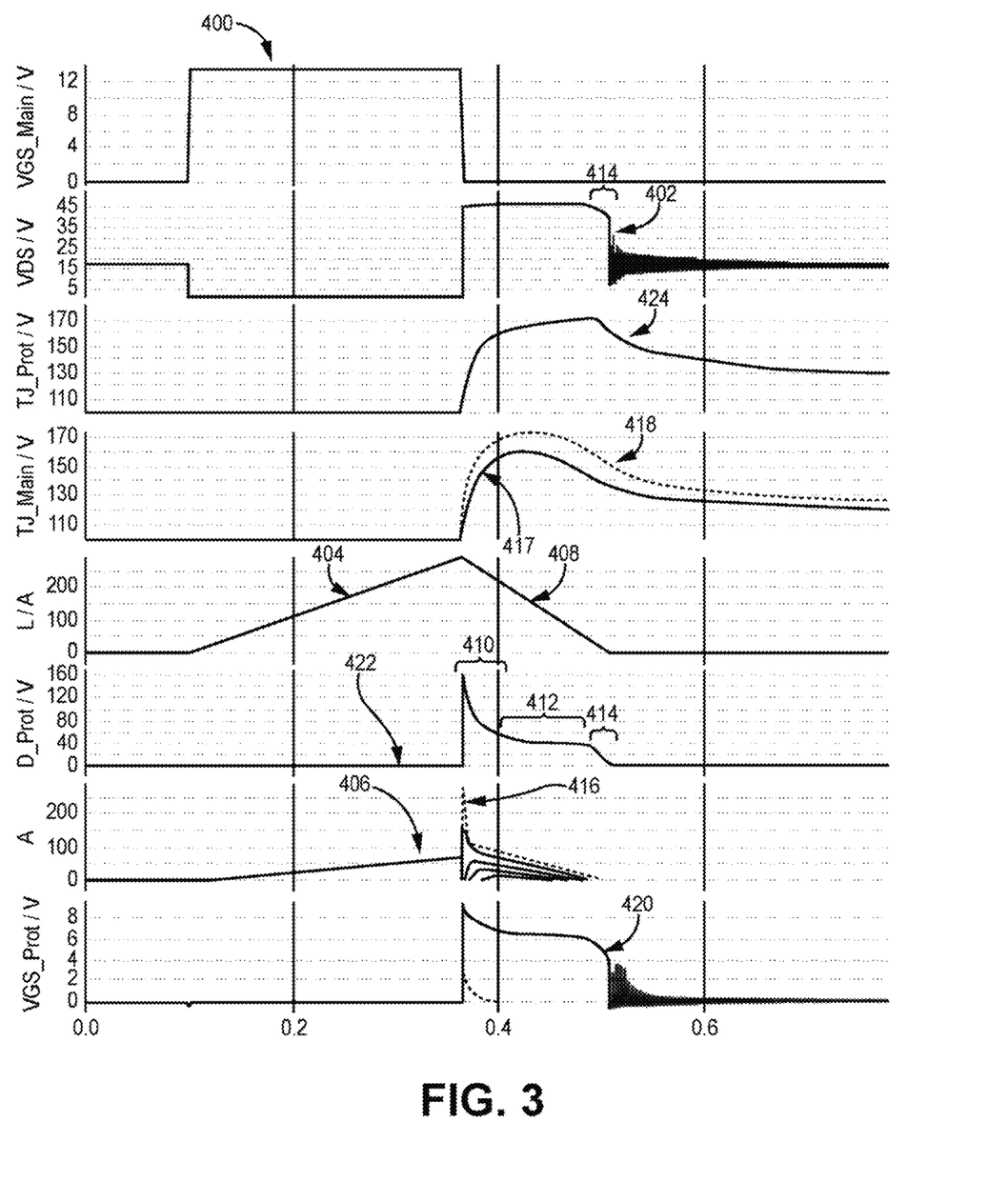
FIG. 3 is a time graph illustrating example circuit behavior for disconnect switch circuitry that includes the protection switch and control circuitry of this disclosure.

FIG. 3 is a time graph illustrating example circuit behavior for disconnect switch circuitry that includes the protection switch and control circuitry of this disclosure. The example of FIG. 3 shows the circuit behavior both with and without the protection circuitry of this disclosure. For example, the main switch current 418 shows the peak current 416 (dashed line) with the protection circuitry turned off or disconnected. The same time graph shows that the peak current for MOSFETS 1, 2, 3 and 4 is less when the protection circuitry is activated and carries some of the current during the peak period 410.

Similar to FIG. 2 described above, when the voltage to the control terminal $V_{GS\_main}$ 400 of the main switch turns ON the main switch, at approximately 100 µs, the drain source voltage $V_{DS}$ 402 decreases, the inductor current, $I_L$. 404 increases, and current 406 through the MOSFETs of the main switch increases. In the example of FIG. 3. $V_{GS\_main}$ 400, $V_{DS}$ 402, and $I_L$ 404 corresponds to Vas M 118, load current 124 and $V_{DS}$ 113, described above in relation to FIG. 1.

When the voltage, $V_{GS\_main}$ 400, to the control terminal of the main switch circuit turns OFF the MOSFETs of the main switch, at approximately 370 µs, the drain source voltage $V_{DS}$ 402, across the main switch circuit, and the protection switch circuit when connected, increases to the BVDSS of the main switch circuit, the inductor current, $I_L$ 404 increases and is still carried by the main switch circuit as described above in relation to FIGS. 1 and 2. As described above in relation to FIG. 1, the one or more MOSFETs used for the protection switch circuit may have a higher breakdown voltage than the MOSFETs used for the main switch circuit. Because both the protection switch circuit and main switch circuit are subject to the same $V_{DS}$ 402, a higher BVDSS for the MOSFET, or MOSFETs of the protection switch may avoid the protection switch circuit from going into avalanche when the main switch circuit goes into avalanche and the control circuitry may accurately control the protection switch as shown by current $I_{D\_prot}$ 422.

Control circuitry, e.g., control circuitry 110 described above in relation to FIG. 1, may detect a fault on load side of the main switch, e.g., by detecting the drain-source voltage increase. In some examples, the control circuitry may compare the drain-source voltage, $V_{DS}$ 402, to a threshold. When the drain-source voltage of the main switch circuit, and the protection switch circuit, satisfies an overvoltage threshold, the control circuitry may determine that there is some fault. In response to detecting the fault, the control circuitry cause the protection switch circuit to carry a first magnitude of electrical current for a first duration 410 and carry a second magnitude of electrical current for a second duration 412 subsequent to the first duration 410.

In some examples, the control circuitry may turn ON the protection MOSFET in linear mode when the drain-source overvoltage is detected. In some examples, the overvoltage detection level for the control circuitry may be selected to be less than the break-down voltage level of the main switch, but higher than the maximum voltage level expected to be delivered by the power supply, e.g., voltage source 102 described above in relation to FIG. 1. To avoid that the protection MOSFET takes all the inductive energy, the control circuitry may limit the current carried by the protection MOSFET, which can be achieved limiting the gate voltage, $V_{GS\_prot}$ 420. Gate voltage, $V_{GS\_prot}$ 420 corresponds to Vas P 116, described above in relation to FIG. 1. In this manner the protection switch circuit may act like a drain-source voltage clamp with current limit. To avoid that the protection MOSFET goes into avalanche at any time, the break-down voltage of the protection MOSFET may be selected higher than the break-down voltage of the main switch. In other words, selecting the characteristics of the protection circuit components may depend on the characteristics of the main switch circuit components. In some examples, e.g., for a "weak" short circuit the current limitations set by the control circuitry for the first and second durations may not be active, because the inductor current is not high enough.

Because of the current limit set by the control circuitry, the drain-source voltage for the first duration 410 and the second duration 412 may initially be still limited by the break-down voltage of the main switch until the inductor current goes below the current limit value of set by the control circuitry for the protection switch circuit. The control circuitry limits the protection switch current in two different ways. A higher current limit acts dynamically and allows more current during the beginning of the MOSFET main switch avalanche event, e.g., duration 410. Carrying more electrical current initially may help to reduce the maximum avalanche current limit of the main switch significantly. Selecting MOSFETs for the main switch circuit with a reduced maximum avalanche current limit before there is a risk of latch-up damage, may have the advantage of a lower cost, and a smaller footprint, when compared to using MOSFETS for the main switch that are manufactured to handle higher maximum avalanche current limits.

During the final duration 414, the drain-source voltage 402 decreases, as shown in both the graph for $V_{DS}$ 402 and drain current $I_D$ 422. The control circuitry may control the VGS_prot 420 so that the protection switch MOSFET carries all the remaining inductor current, until the current decreases to zero. In other words, over the final duration 414 the current limit set by the control circuitry approximates to a lower current limit, which stays active until the energy stored in the inductor is gone.

In some examples, the control circuitry may be configured to ensure a smooth transition between the magnitude of current carried by the protection switch during the first duration 410 and the magnitude of current carried by the protection switch during the second duration 412. In other words, the control circuitry may control $V_{GS\_prot}$ 420 so that the protection switch circuit avoids an abrupt current change, such as a step change in current $I_{D\_prot}$ 422 as the electrical current transitions to different levels. Said another way, the control circuitry may be configured to output the control voltage, $V_{GS\_prot}$ 420, to the control terminal for the protection switch circuit to cause an asymptotic transition, e.g., an exponential curve in current, from the first magnitude of electrical current transitions to the second magnitude of electrical current.

In other examples, the control circuitry may output the control signal so the "smooth" transition between the current magnitude for the first duration and the second duration, is a linear transition, a piecewise linear, multiple small steps, or any other variation that avoids an abrupt current change, such as a single large step change between the first current magnitude and second current magnitude. A smooth transition, as described above, may provide advantages over an abrupt transition. For example, a single large step, or one or more large steps, may result in ringing and inaccurate control of the current. A smooth transition, e.g., multiple small steps, the asymptotic transition, or other "smooth" transition described above may also allow other MOSFETs of the main switch to equalize and help carry some of the current, rather than just the one or two MOSFETs that break down first.

In some examples, the first magnitude of electrical current is greater than the second magnitude of electrical current, e.g., first duration 410 may be shorter in time and the protection switch carry a higher current compared to the second duration 412. In some examples, first duration 410 may be less than or equal to 100 microseconds (μs). As described above in relation to FIG. 1, the control circuitry reacts dynamically so that the protection MOSFET takes more current at the beginning e.g. for first duration 410, when the break-down voltages of the parallel MOSFETS of the main switch may not be aligned, and a high avalanche current may risk main switch latch-up damage.

Figure 4A:
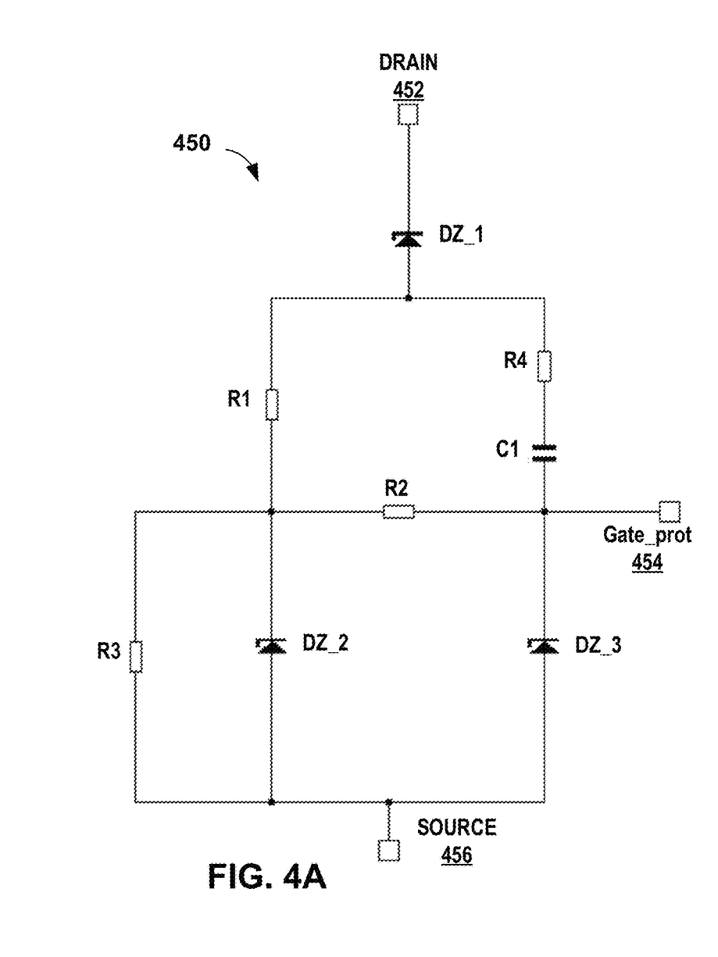
FIGS. 4A and 4B are schematic diagrams illustrating example analog circuit implementations of the control circuitry of this disclosure.
Figure 4B:
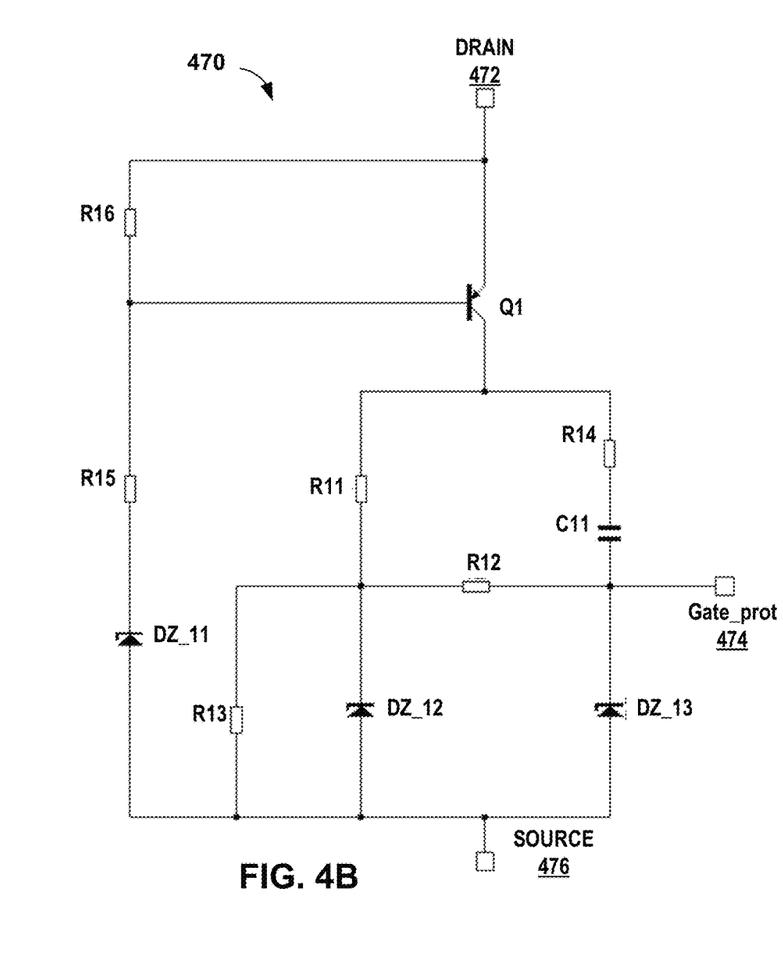

FIGS. 4A and 4B are schematic diagrams illustrating example analog circuit implementations of the control circuitry of this disclosure. As described above in relation to FIG. 1, the control circuitry of this disclosure, e.g., detection and control circuitry 110, may also be implemented using digital circuitry (not shown in FIGS. 4A and 4B), e.g., using processing circuitry, analog to digital converters and similar circuitry to detect a fault, and to control the operation of the protection switch circuit as described above in relation to FIGS. 1-3.

Control circuitry 450 shown in the example of FIG. 4A is configured to minimize usage of components external to the protection switch circuit, e.g., protection switch circuit 120 of FIG. 1. The cathode of DZ_1 connects to drain 452 and is configured to connect to the drain of the protection switch circuit and main switch circuit, e.g., to drain 114 of FIG. 1. DZ_1 is a Zener diode used as reference to adjust the overvoltage detection level. As soon as DZ_1 breaks down due to a high voltage at drain, DZ_1 has a pull up effect on the control terminal, gate_prot 454 of the MOSFET, or MOSFETs, of the protection switch circuit. The anode of DZ_1 connects to gate_prot 454 through the series connection of resistor R4 and capacitor C1. The anode of DZ_1 also connects to the cathode of DZ_2 through resistor R1 and to source 456 through resistor R3.

To limit the gate voltage for the protection switch circuit and therefore limit the drain current ($I_D$) of the protection switch circuit, two additional Zener diodes may be used to set the current limits, as described above in relation to FIGS. 1-3. The anodes of both DZ_2 and DZ_3 connect to source 456 and are configured to connect to the source of the protection switch circuit and main switch circuit, e.g., source 102 of FIG. 1. The cathode of DZ_3 connects to gate_prot 454 and to R2. Resistor R2 connects between the cathode of DZ_2 and gate_prot 454.

The break-down voltage of DZ_2 is lower than the breakdown voltage of DZ_3. DZ_2 sets the gate voltage of the lower current limit, e.g., the current carried by the protection switch circuit for the second duration 412, described above in relation to FIG. 3. DZ_3 limits the gate voltage for the dynamic higher initial current limit for the first duration 410 of FIG. 3.

In operation, the higher current limit set by DZ_3 is dominant in this example. After DZ_1 causes activation of the protection circuit set by DZ_3 limits the magnitude of current carried by the protection switch circuit. The break-down value of DZ_3 may be selected to ensure the magnitude of current still carried by the MOSFETS of the main switch circuit is less than the maximum current for the main switch circuit that may result in latch-up damage. Between the first duration and second duration, e.g., 410 and 412 of FIG. 3, control circuit 450 reduces the gate voltage from the higher voltage initially determined by DZ_3 to the lower voltage level determined by DZ_2 and stays active as long as the voltage across DZ_1 causes DZ_1 to remain in break down. The values of resistor R2 and capacitor C1 may be used to adjust the active time of the higher current limit, e.g., to set the duration of 410. The RC circuit of R2 and C1 may also be used to cause a smooth transition between the magnitude of current carried by the protection circuit during 410 and the current carried during 412, as described above in relation to FIG. 3. In other examples, not shown in FIGS. 4A and 4B, a control circuit implemented with a digital controller may output the control signal to execute the smooth transition as described above in relation to FIG. 3.

R3 is used as pull-down resistance to source 456 to discharge the voltage at gate_prot 454, when DZ_1 is not breaking down anymore. In some examples the value of R4 may be selected to also limit the current through Zener diode DZ_3, to avoid violating the maximum limits of the DZ_3.

As noted above, the resistance value of R4 may have an impact on the reaction speed of circuit 450, therefore both circuit response and component protection may be factors in selecting R4. The drain-source overvoltage detection level is defined by the sum of voltages across the protection circuit: VDS,OV≈VDZ1+VR4+VC1+VGate_Prot.

Circuit 470 in the example of FIG. 4B may work very similar compared to control circuit 450 of FIG. 4A. One difference includes the more complex overvoltage detection circuitry that use more components. Q1 is a PNP bipolar junction transistor (BJT). The emitter of Q1 connects to drain 472 and is configured to connect to drain 114 of FIG. 1. The collector of Q1 connects to gate_prot 474 through the series combination of resistor R14 and capacitor C11, which correspond to R4 and C1 of FIG. 4A. R16 connects the emitter and base of BJT Q1. The base of Q1 connects to source 476 through the series arrangement of resistor R15 and Zener diode DZ_11.

When DZ_11 is breaking down, BJT Q1 is turned on to achieve the desired pull-up effect on the gate of the protection switch circuit, gate_prot 474. R16 is used to bias the base of Q1 and R15 is used to limit the base current. In this way the overvoltage detection level (e.g., fault detection as described above in relation to FIGS. 1 and 3) is $V_{Ds,ov} \approx V_{DZ1}$ neglecting the base diode voltage of Q1 and the voltage drop across R15. The arrangement and operation of the remaining portion of circuit 470 is the same as described above in relation to FIG. 4A. The components, R11, R12, R13, DZ_12 and DZ_13 of FIG. 4B correspond, respectively to components R1, R2, R3, DZ_2 and DZ_3 of FIG. 4A.

The reaction speed compared to circuit 450 may be increased due to the current amplification of BJT Q1. Another advantage is that the reference voltage for DZ_1 may still connect to source 476, as shown in FIGS. 4A and 4B, but for circuit 470, the reference for DZ_1 could be also some different reference. For example, the anode of DZ_1 may instead connect to ground (e.g., GND depicted in FIG. 1) to suppress overvoltage spikes referring to GND (not shown in FIG. 4B). Circuit 470 may also have an advantage in precise control of the control signal output to gate_prot 474, because voltages across C1 and gate_prot 474 change over time. The arrangement of control circuitry 470 may operate to keep the drain-source overvoltage detection level constant.

Figure 5:
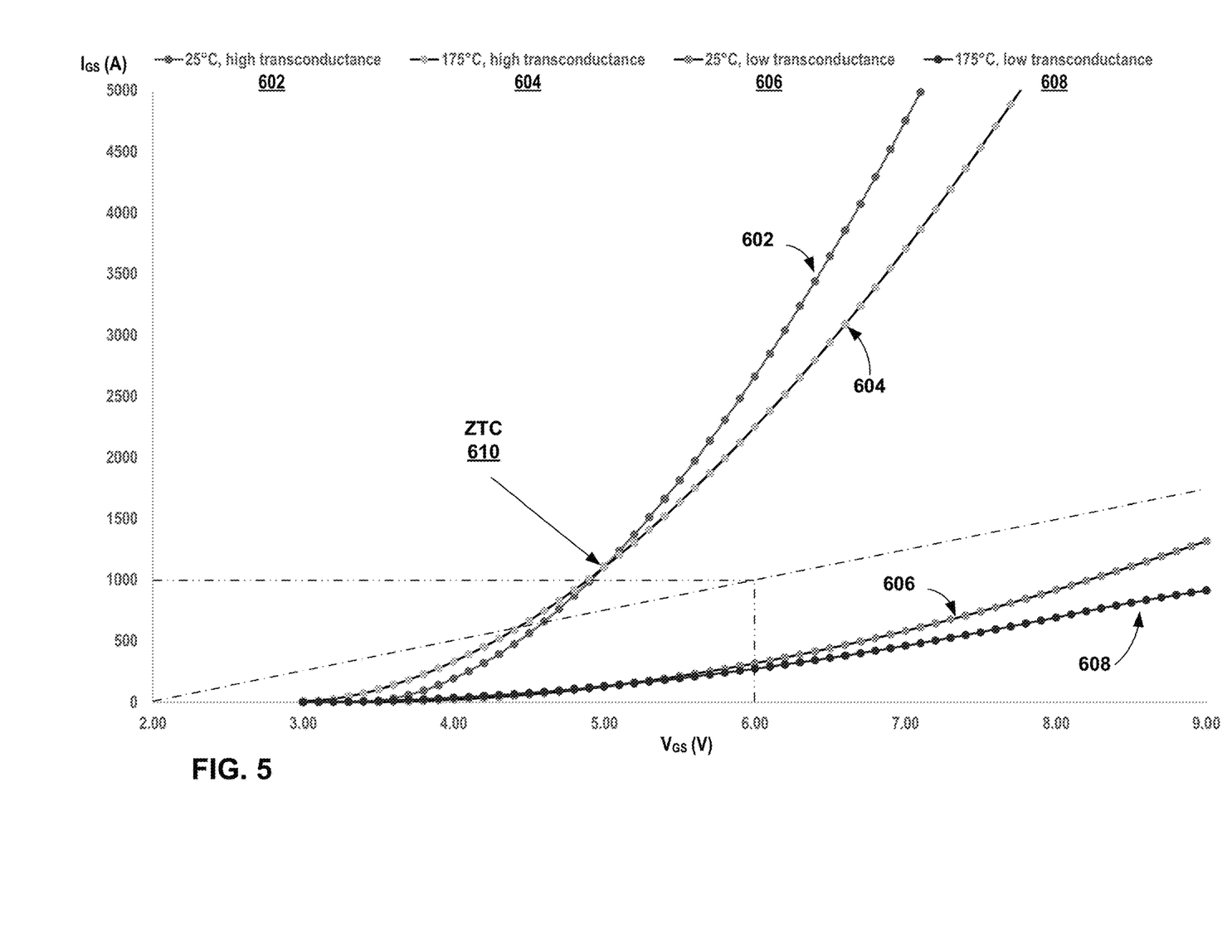
FIG. 5 is a graph illustrating a comparison for example transconductance behavior for the protection switch of this disclosure.

FIG. 5 is a graph illustrating a comparison for example transconductance behavior for the protection switch of this disclosure. Selecting the MOSFET, or MOSFETs, for the protection switch circuit may include selecting the MOSFET based on the transconductance behavior. Because precise voltage controlled current is desirable for the protection circuitry of this disclosure, a flat transfer characteristics to minimize the change of drain current dependent on the gate voltage (low transconductance $dI_D/dV_{GS}$) may be desirable for the protection MOSFET. As described above in relation to FIGS. 3, 4A and 4B, the maximum protection switch current is defined by controlling the gate voltage of the protection MOSFET based on the control signal output by the control circuitry.

A MOSFET with a high transconductance may be less desirable for the protection switch circuit of this disclosure. FIG. 5 depicts an example high transconductance transistor operating at 25° C. 602, and also operating at 175° C. 604. The high conductance transistor also has a distinct zero temperature coefficient (ZTC) point 610. In contrast, FIG. 5 also shows an example of a MOSFET with low, or flat, transconductance characteristics operating at 25° C. 606, and also operating at 175° C. 608. In the example of FIG. 5, the low transconductance MOSFET has a characteristic $dI_D/dV_{GS}$ of less than 168 amperes/volt (A/V). In some examples, the MOSFET, or MOSFETs selected for the protection switch of this disclosure may have a characteristic flat transconductance of less than 200 amperes/volt within an operating temperature range of the protection switch.

Figure 6A:
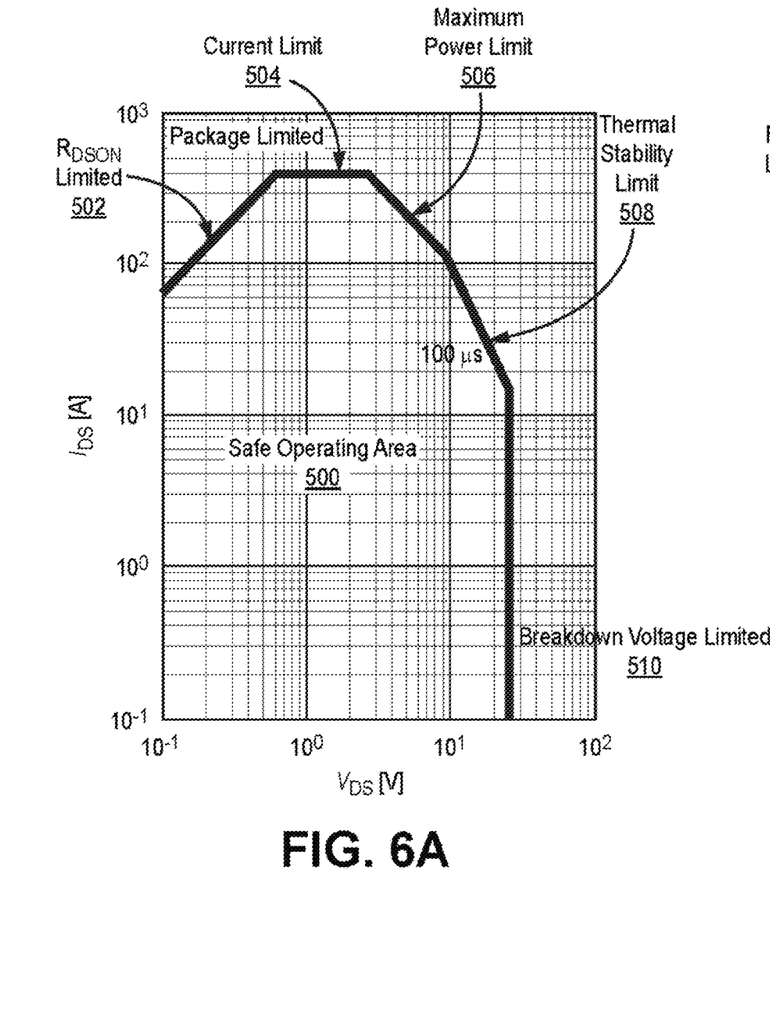
FIGS. 6A and 6B are graphs illustrating example safe operating area characteristics for the protection switch of this disclosure.
Figure 6B:
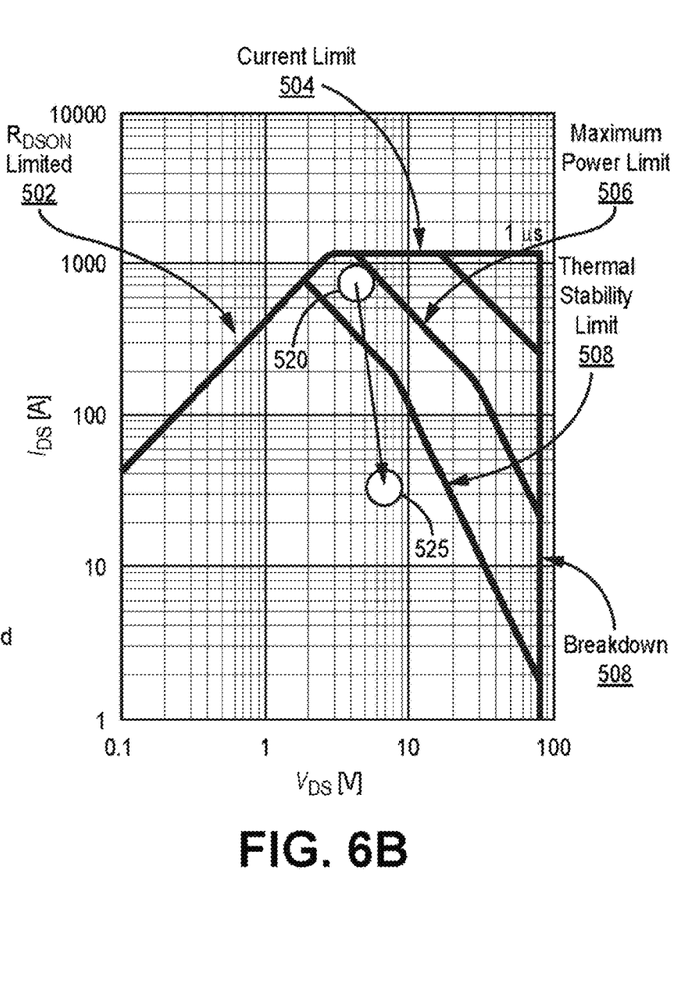

FIGS. 6A and 6B are graphs illustrating example safe operating area characteristics for the protection switch of this disclosure. Operating in linear mode, described above in relation to FIG. 1, will operate the MOSFET at high VDS and IDS simultaneously, when compared to in saturation. Consequently, power dissipation will be high. The safe operating area (SOA) diagram is a tool to evaluate the suitability of the MOSFET operation in linear mode. The example of FIG. 6A describes a generic SOA diagram and the various limit-lines that define SOA 500.

When operating continuously in linear mode, the one or more MOSFETs for the protection switch circuit of this disclosure may act as a current source. For continuous operation in linear mode the RDS(on) and dynamic parameters of the MOSFET may be less relevant to judge power dissipation and suitability of the MOSFET, but the shape and location of SOA 500 may be a useful design criterium. Thermal design may be useful, therefore a MOSFET with low thermal impedance (ZthJC) may be desirable in the protection switch circuit of this disclosure. The appropriate package and cooling may also be useful considerations to remove the generated heat. Thermal instability may be reduced or avoided by utilizing MOSFETs with low ZTC point, as described above in relation to FIG. 5A.

In the example of FIG. 6A, SOA 500 is defined by five limit-lines. These limit lines include RDS(on) limit-line 502, the current limit-line 504, the maximum power limit-line 506, the thermal instability limit-line 508 and the breakdown voltage limit-line 510. The shape and size of SOA 500 may not only depend on MOSFET characteristics but also for the operating temperature and pulse duration including up to continuous operation (DC operation).

The RDS(on) limit-line 502 gives a linear dependency between VDS and IDS. The slope of the line is simply the maximum RDS(on) of the MOSFET at a selected temperature and gate-source voltage ($V_{GS}$). The electrical current limit line 504 may also be described as the package-limit-line and may be defined by the maximum current the package can handle. Therefore the amount of this current may be package dependent. For example, circuit packages with bond wires will show different maximum current handling capabilities compared to packages with clip bonding technology. Also the die size may impact the current handling capability of the package since it determines the bonding scheme (number of bond wires, bond wire diameter, clip dimension). Current limit-line 504 may not change when application conditions such as ambient temperature vary.

The slope and location of maximum power limit 506 may depend on the maximum power the system is allowed to generate to reach a stable junction temperature in thermal equilibrium at the operating temperature. The cooling concept of the system, and therefore thermal variables like case temperature (Tc) and thermal impedance (ZthJC) may impact the maximum power limit 506.

The drain-source current for the protection switch MOSFET, $I_{DS}$, may be influenced by the value of the thermal impedance ZthJC. For short pulses the value of ZthJC depends on the pulse length and pulse duty cycle. Because of increased power dissipation with increasing $V_{DS}$, e.g., for both the main switch and protection switch as described above in relation to FIG. 1, the protection switch $I_{DS}$ may also depend on indirect proportionality on the applied $V_{DS}$ voltage. The drain-source voltage depends on the breakdown voltage for the MOSFETs of the main switch circuit, as described above in relation to FIGS. 2 and 3.

The thermal instability limit 508 begins at the point at which the slope of the maximum power limit 506 changes. The difference between the slope of the maximum power limit 506 and thermal instability limit 508 may be a useful parameter to consider when selecting a MOSFET for the protection switch circuit if this disclosure. The criterium for thermal instability may be described as a MOSFET (or generally a system) is considered to be thermally un-stable in an example in which the power generation (Pgenerated) rises faster than the power dissipation (Pdissipated) over temperature. Unlike for the maximum power limit 506, which is in thermal equilibrium, the thermal stability limit 508 indicates instability. Thermal instability may occur with the temperature coefficient for the MOSFET drain-source current ($dI_{DS}/dT$) is positive, which may occur when the $V_{GS}$ for the MOSFET is less than the ZTC point of the transconductance curve, depicted in FIG. 5.

The final limit line of SOA 500 is given by the MOSFETs maximum applicable $V_{DS}$ voltage, which is generally the breakdown voltage BVDSS of the device. Exceeding the maximum $V_{DS}$, beyond the breakdown voltage limit 510, voltage will lead to MOSFET junction breakdown and without any current or power limiting scheme the MOSFET may face thermal destruction, as described above in relation to FIGS. 1-3.

The example of FIG. 6B depicts an example SOA curve for a MOSFET that may be used in the protection switch circuit of this disclosure. The example of FIG. 6B includes the same RDS(on) limit-line 502, the current limit-line 504, the maximum power limit-line 506, the thermal instability limit-line 508 and the breakdown voltage limit-line 510 as described above in relation to FIG. 6A.

As described above in relation to FIG. 1, in operation, the control circuitry is configured to detect an overvoltage condition across the drain-source channel, and in response to the overvoltage condition, cause the protection switch to operate in the linear region. A control signal, e.g., control signal 126 from control circuitry 110 of FIG. 1, may cause the protection switch circuit to carry a first magnitude of electrical current 520 for a first duration and carry a second magnitude of electrical current 525 for a second duration. As described above, the drain-source voltage, $V_{DS}$, of the main switch circuit, and the protection switch circuit, is based on the break-down voltage for the plurality of MOSFETs of the main switch. The first electrical current 520 is greater than the second electrical current 525. The linear operation characteristics of the protection switch comprises a safe operating area for the protection switch such that the first magnitude of electrical current 520 and the second magnitude of electrical current 525 remain within the SOA.

Figure 7:
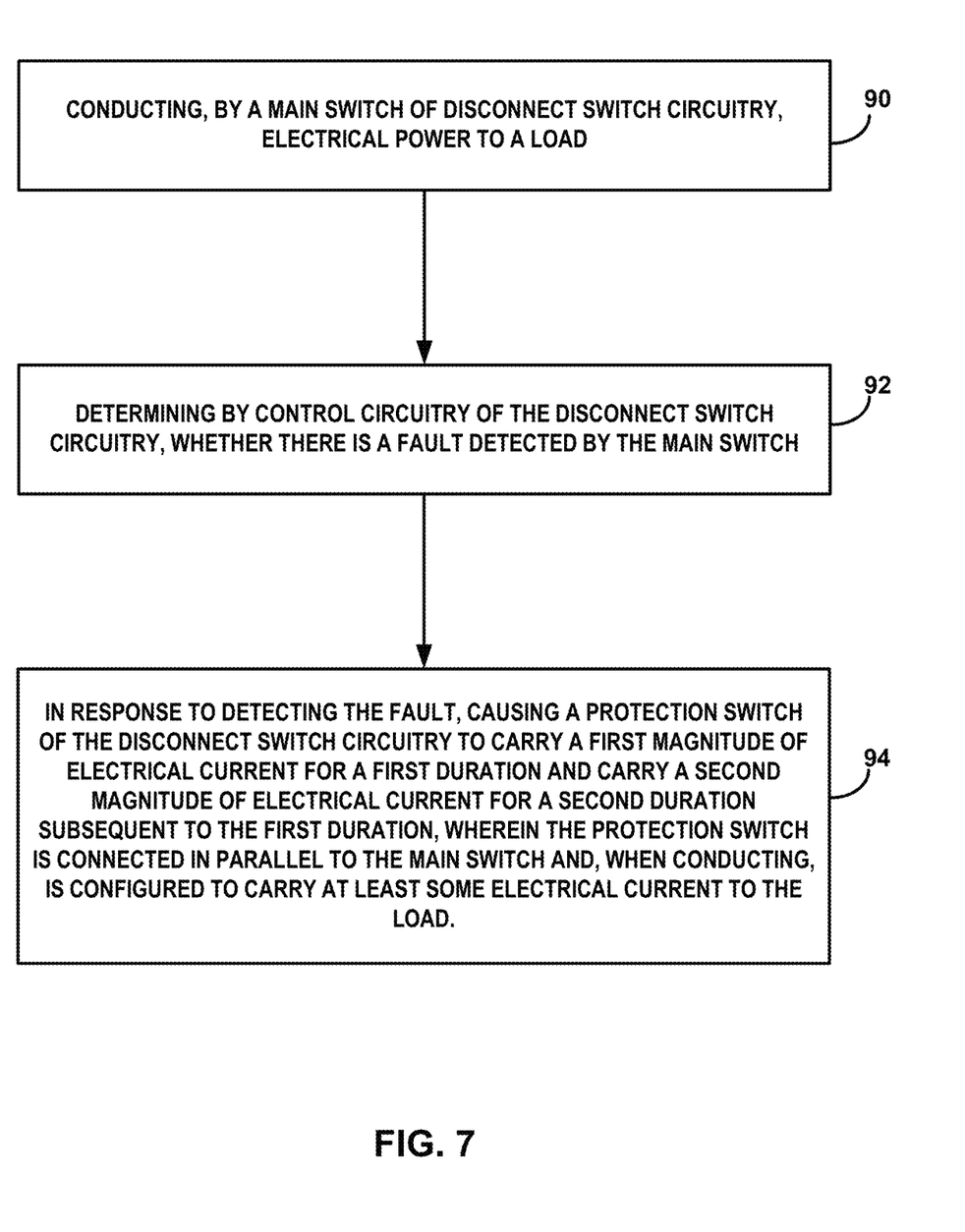
FIG. 7 is a flow chart illustrating and example operation of the circuitry of this disclosure.

FIG. 7 is a flow chart illustrating and example operation of the circuitry of this disclosure. The blocks of FIG. 7 will be described in terms of FIG. 1, unless otherwise noted.

Main switch circuit 112 of disconnect switch circuitry of system 100, may conduct electrical power from voltage source 102 to load 108, e.g., during normal load operation (90). Main switch 122 may be implemented by two or more MOSFETs connected in parallel with each other to share the load current 124 to load 108.

Control circuitry 110 of the disconnect switch circuitry, may be configured to determine whether there is a fault, e.g., low resistance fault 106, detected by the main switch 122 (92). As described above in relation to FIG. 1, detection and control circuitry 110 may compare the voltage between drain 114 and source 112 to a threshold. When the measured drain-source voltage exceeds the threshold, control circuitry 110 may determine that main switch 122 has opened to stop load current 124 because of a fault such as low resistance fault 106.

In response to detecting the fault, control circuitry 110 may cause protection switch 120 of the disconnect switch circuitry to carry a first magnitude of electrical current, e.g., current 520 of FIG. 6B, for a first duration, e.g., duration 410 of FIG. 3 based on the voltage of control signal 126 applied to the control terminal of protection switch circuit 120, resulting in $V_{GS\_P}$ 116 (94). For a second duration, e.g., 412 of FIG. 3, subsequent to the first duration, the control signal from control circuitry 110 may cause protection switch circuit 120 to carry a second magnitude of electrical current.

In one or more examples, the functions described above may be implemented in hardware, software, firmware, or any combination thereof. For example, the various components of FIG. 1 may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC), Field programmable gate array (FPGAs), or other equivalent integrated or discrete logic circuitry. Accordingly, the term "processor," and "processing circuitry" as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above.

The techniques of this disclosure may also be described in the following example clauses.

Clause 1: A circuit comprising a main switch circuit, configured to connect a power source to a load, the main switch circuit comprising a plurality of metal oxide semiconductor field effect transistors (MOSFET), wherein the plurality of MOSFETs are arranged in parallel; a protection switch circuit connected in parallel to the main switch circuit and, wherein the protection switch circuit, when conducting, is configured to carry at least some electrical current to the load; and control circuitry connected to a control terminal of the protection switch, wherein the control circuitry is configured to: detect a fault on load side of the main switch; and in response to detecting the fault, cause the protection switch circuit to carry a first magnitude of electrical current for a first duration and carry a second magnitude of electrical current for a second duration subsequent to the first duration.

Clause 2: The circuit of clause 1, wherein the detected fault is based on a drain-source voltage of the main switch circuit that satisfies an overvoltage threshold.

Clause 3: The circuit of clause 2, wherein the overvoltage threshold is based on at least: a break-down voltage for the plurality of MOSFETs of the main switch circuit; and a maximum expected voltage of the power source.

Clause 4: The circuit of any of clauses 1 through 3, wherein a drain-source voltage of the main switch circuit for the first duration and the second duration is based on a break-down voltage for the plurality of MOSFETs of the main switch circuit, and wherein the control circuitry is configured to output a control voltage to the control terminal for the protection switch circuit such that the first magnitude of electrical current carried by the protection switch circuit is configured to prevent latch-up damage for the main switch circuit.

Clause 5: The circuit of any of clauses 1 through 4, wherein the control circuitry is configured to output a control voltage to the control terminal for the protection switch to cause an asymptotic transition from the first magnitude of electrical current transitions to the second magnitude of electrical current that avoids a step change in electrical current magnitude.

Clause 6: The circuit of any of clauses 1 through 4, wherein the control circuitry is configured to output a control voltage to the control terminal for the protection switch to cause a smooth transition from the first magnitude of electrical current transitions to the second magnitude of electrical current, wherein a smooth transition comprises any one or more of a linear transition, a piecewise linear, an exponential transition, and multiple small steps.

Clause 7: The circuit of any of clauses 1 through 6, wherein the first magnitude of electrical current is greater than the second magnitude of electrical current.

Clause 8: The circuit of any of clauses 1 through 7, wherein the first duration is less than or equal to 100 microseconds (µs).

Clause 9: A device comprising a protection switch circuit arranged in parallel with the main switch circuit, wherein the main switch circuit comprises a plurality of metal oxide semiconductor field effect transistors (MOSFETs) arranged in parallel with each other, wherein the main switch circuit is configured to connect a power source to a load, and wherein the protection switch comprises a control terminal and a drain-source channel, wherein the protection circuit is configured to: receive a control signal at the control terminal; and in response to the control signal causing the protection switch to operate in a linear region, carry at least some electrical current to the load.

Clause 10: The device of clause 9, wherein the protection switch comprises a MOSFET with a low transconductance, $dI_D/dV_{GS}$, wherein a low transconductance is a transconductance of less than 200 amperes/volt within an operating temperature range of the protection switch.

Clause 11: The device of any of clauses 9 and 10, wherein the control signal causes the protection switch circuit to carry a first magnitude of electrical current for a first duration and carry a second magnitude of electrical current for a second duration, wherein the second duration is longer than the first duration, wherein the first magnitude of electrical current is greater than the second magnitude of electrical current, wherein drain-source voltage of the main switch circuit is based on a break-down voltage for the plurality of MOSFETs of the main switch, and wherein linear operation characteristics of the protection switch comprises a safe operating area (SOA) for the protection switch such that the first magnitude of electrical current and the second magnitude of electrical current are within the SOA.

Clause 12: The device of any of clauses 9 through 11, wherein the control circuitry is configured to detect an overvoltage condition across the drain-source channel, and in response to the overvoltage condition, cause the protection switch to operate in the linear region.

Clause 13: The device of any of clauses 9 through 12, further comprising further comprising the control circuitry, wherein the control circuitry comprises analog circuitry configured to: detect the overvoltage condition; cause the protection switch to carry a first magnitude of electrical current for a first duration and carry a second magnitude of electrical current for a second duration subsequent to the first duration.

Clause 14: The device of any of clauses 9 through 13, further comprising further comprising the control circuitry, wherein the control circuitry comprises digital circuitry configured to: detect the overvoltage condition; cause the protection switch to carry a first magnitude of electrical current for a first duration and carry a second magnitude of electrical current for a second duration subsequent to the first duration.

Clause 15: A method comprising conducting, by a main switch of disconnect switch circuitry, electrical power to a load, wherein the main switch comprises a plurality of metal oxide semiconductor field effect transistors (MOSFET), wherein the plurality of MOSFETs are arranged in parallel; determining by control circuitry of the disconnect switch circuitry, whether there is a fault on a load side of the main switch; in response to detecting the fault, causing a protection switch of the disconnect switch circuitry to carry a first magnitude of electrical current for a first duration and carry a second magnitude of electrical current for a second duration subsequent to the first duration, wherein the protection switch is connected in parallel to the main switch and, when conducting, is configured to carry at least some electrical current to the load.

Clause 16: The method of clause 15, wherein the detected fault is based on a drain-source voltage of the main switch circuit that satisfies an overvoltage threshold.

Clause 17: The method of clause 16, wherein the overvoltage threshold is based on at least: a break-down voltage for the plurality of MOSFETs of the main switch circuit; and a maximum expected voltage of the power source.

Clause 18: The method of any of clauses 15 through 17, wherein a drain-source voltage of the main switch circuit for the first duration and the second duration is based on a break-down voltage for the plurality of MOSFETs of the main switch circuit, the method further comprising outputting, by the control circuitry, a control voltage to the control terminal for the protection switch circuit such that the first magnitude of electrical current carried by the protection switch circuit is configured to prevent latch-up damage for the main switch circuit.

Clause 19: The method of any of clauses 15 through 18, further comprising, outputting, by the control circuitry, a control voltage to the control terminal for the protection switch to cause an asymptotic transition from the first magnitude of electrical current transitions to the second magnitude of electrical current that avoids a step change in electrical current magnitude.

Clause 20: The method of any of clauses 15 through 19, wherein the first magnitude of electrical current is greater than the second magnitude of electrical current.

Various examples of the disclosure have been described. These and other examples are within the scope of the following claims.

What is claimed is:

1. A circuit comprising:
   a main switch circuit, configured to connect a power source to a load, the main switch circuit comprising a plurality of metal oxide semiconductor field effect transistors (MOSFET), wherein the plurality of MOSFETs are arranged in parallel;
   a protection switch circuit connected in parallel to the main switch circuit and, wherein the protection switch circuit, when conducting, is configured to carry at least some electrical current to the load; and
   control circuitry connected to a control terminal of the protection switch circuit, wherein the control circuitry is configured to:
      detect a fault on load side of the main switch circuit; and
      in response to detecting the fault, cause the protection switch circuit to carry a first magnitude of electrical current for a first duration and carry a second magnitude of electrical current for a second duration subsequent to the first duration,
   wherein a drain-source voltage of the main switch circuit for the first duration and the second duration is based on a break-down voltage for the plurality of MOSFETs of the main switch circuit, and
   wherein the control circuitry is configured to output a control voltage to the control terminal for the protection switch circuit such that the first magnitude of electrical current carried by the protection switch circuit is configured to prevent latch-up damage for the main switch circuit.

2. The circuit of claim 1, wherein the detected fault is based on the drain-source voltage of the main switch circuit that satisfies an overvoltage threshold.

3. The circuit of claim 2, wherein the overvoltage threshold is based on at least:
   a break-down voltage for the plurality of MOSFETs of the main switch circuit; and
   a maximum expected voltage of the power source.

4. A circuit comprising:
   a main switch circuit, configured to connect a power source to a load, the main switch circuit comprising a plurality of metal oxide semiconductor field effect transistors (MOSFET), wherein the plurality of MOSFETs are arranged in parallel;
   a protection switch circuit connected in parallel to the main switch circuit and, wherein the protection switch circuit, when conducting, is configured to carry at least some electrical current to the load; and
   control circuitry connected to a control terminal of the protection switch circuit, wherein the control circuitry is configured to:
      detect a fault on load side of the main switch circuit; and
      in response to detecting the fault, cause the protection switch circuit to carry a first magnitude of electrical current for a first duration and carry a second magnitude of electrical current for a second duration subsequent to the first duration, wherein the control circuitry is configured to output a control voltage to the control terminal for the protection switch circuit to cause an asymptotic transition from the first magnitude of electrical current transitions to the second magnitude of electrical current that avoids a step change in electrical current magnitude.

5. The circuit of claim 4, wherein the control circuitry is configured to output a control voltage to the control terminal for the protection switch circuit to cause a smooth transition from the first magnitude of electrical current transitions to the second magnitude of electrical current, wherein a smooth transition comprises any one or more of a linear transition, a piecewise linear, an exponential transition, and multiple small steps.

6. The circuit of claim 1, wherein the first magnitude of electrical current is greater than the second magnitude of electrical current.

7. The circuit of claim 1, wherein the first duration is less than or equal to 100 microseconds (µs).

8. A device comprising:
   a protection switch circuit arranged in parallel with a main switch circuit, wherein the main switch circuit comprises a plurality of metal oxide semiconductor field effect transistors (MOSFETs) arranged in parallel with each other, wherein the main switch circuit is configured to connect a power source to a load, and wherein the protection switch circuit comprises a control terminal and a drain-source channel,
   wherein the protection switch circuit is configured to:
   receive a control signal at the control terminal; and
   in response to the control signal causing the protection switch circuit to operate in a linear region, carry at least some electrical current to the load, wherein the protection switch circuit comprises a MOSFET with a low transconductance, $dI_D/dV_{GS}$, wherein the low transconductance is a transconductance of less than 200 amperes/volt within an operating temperature range of the protection switch.

9. The device of claim 8,
   wherein the control signal causes the protection switch circuit to carry a first magnitude of electrical current for a first duration and carry a second magnitude of electrical current for a second duration,
   wherein the second duration is longer than the first duration,
   wherein the first magnitude of electrical current is greater than the second magnitude of electrical current,
   wherein drain-source voltage of the main switch circuit is based on a break-down voltage for the plurality of MOSFETs of the main switch circuit, and
   wherein linear operation characteristics of the protection switch circuit comprises a safe operating area (SOA) for the protection switch circuit such that the first magnitude of electrical current and the second magnitude of electrical current are within the SOA.

10. The device of claim 8, wherein control circuitry is configured to:
    detect an overvoltage condition across the drain-source channel, and
    in response to the overvoltage condition, output the control signal to cause the protection switch circuit to operate in the linear region.

11. The device of claim 10, further comprising the control circuitry,
    wherein the control circuitry comprises analog circuitry configured to:
    detect the overvoltage condition; and
    cause the protection switch circuit to carry a first magnitude of electrical current for a first duration and carry a second magnitude of electrical current for a second duration subsequent to the first duration.

12. The device of claim 10, further comprising the control circuitry,
wherein the control circuitry comprises digital circuitry configured to:
detect the overvoltage condition; and
cause the protection switch circuit to carry a first magnitude of electrical current for a first duration and carry a second magnitude of electrical current for a second duration subsequent to the first duration.

13. A method comprising:
conducting, by a main switch circuit of disconnect switch circuitry, electrical power from a power source to a load, wherein the main switch circuit comprises a plurality of metal oxide semiconductor field effect transistors (MOSFET), wherein the plurality of MOSFETs are arranged in parallel;
determining by control circuitry of the disconnect switch circuitry, whether there is a fault on a load side of the main switch circuit; and
in response to detecting the fault, causing a protection switch circuit of the disconnect switch circuitry to carry a first magnitude of electrical current for a first duration and carry a second magnitude of electrical current for a second duration subsequent to the first duration, wherein the protection switch circuit is connected in parallel to the main switch circuit and, when conducting, is configured to carry at least some electrical current to the load, wherein a drain-source voltage of the main switch circuit for the first duration and the second duration is based on a break-down voltage for the plurality of MOSFETs of the main switch circuit, the method further comprising:
outputting, by the control circuitry, a control voltage to a control terminal for the protection switch circuit such that the first magnitude of electrical current carried by the protection switch circuit is configured to prevent latch-up damage for the main switch circuit.

14. The method of claim 13, wherein the detected fault is based on the drain-source voltage of the main switch circuit that satisfies an overvoltage threshold.

15. The method of claim 14, wherein the overvoltage threshold is based on at least:
a break-down voltage for the plurality of MOSFETs of the main switch circuit; and
a maximum expected voltage of the power source.

16. A method comprising:
conducting, by a main switch circuit of disconnect switch circuitry, electrical power from a power source to a load, wherein the main switch circuit comprises a plurality of metal oxide semiconductor field effect transistors (MOSFET), wherein the plurality of MOSFETs are arranged in parallel;
determining by control circuitry of the disconnect switch circuitry, whether there is a fault on a load side of the main switch circuit;
in response to detecting the fault, causing a protection switch circuit of the disconnect switch circuitry to carry a first magnitude of electrical current for a first duration and carry a second magnitude of electrical current for a second duration subsequent to the first duration, wherein the protection switch circuit is connected in parallel to the main switch circuit and, when conducting, is configured to carry at least some electrical current to the load; and
outputting, by the control circuitry, a control voltage to a control terminal for the protection switch circuit to cause an asymptotic transition from the first magnitude of electrical current transitions to the second magnitude of electrical current that avoids a step change in electrical current magnitude.

17. The method of claim 13, wherein the first magnitude of electrical current is greater than the second magnitude of electrical current.

* * * * *